United States Patent
Chang et al.

(10) Patent No.: US 7,609,520 B2
(45) Date of Patent: Oct. 27, 2009

(54) HEAT SPREADER WITH VAPOR CHAMBER DEFINED THEREIN

(75) Inventors: Chang-Shen Chang, Taipei Hsien (TW);
Juei-Khai Liu, Taipei Hsien (TW);
Chao-Hao Wang, Taipei Hsien (TW);
Hsien-Sheng Pei, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 27 days.

(21) Appl. No.: 11/752,909

(22) Filed: May 23, 2007

(65) Prior Publication Data

US 2008/0174963 A1  Jul. 24, 2008

(51) Int. Cl.
*H05K 7/20* (2006.01)
*F28D 15/00* (2006.01)
*H01L 23/34* (2006.01)

(52) U.S. Cl. .................. 361/700; 165/80.2; 165/104.33; 257/715

(58) Field of Classification Search .................. None
See application file for complete search history.

(56) References Cited

U.S. PATENT DOCUMENTS

| | | | |
|---|---|---|---|
| 6,901,994 B1 * | 6/2005 | Jin-Cherng et al. | 165/104.26 |
| 7,032,652 B2 * | 4/2006 | Wang et al. | 165/104.26 |
| 7,109,581 B2 * | 9/2006 | Dangelo et al. | 257/720 |
| 7,447,029 B2 * | 11/2008 | Lai et al. | 361/700 |
| 2004/0016534 A1 | 1/2004 | Lai | |
| 2005/0092467 A1 * | 5/2005 | Lin et al. | 165/104.26 |
| 2005/0092469 A1 * | 5/2005 | Huang | 165/126 |
| 2007/0068654 A1 * | 3/2007 | Chang | 165/104.21 |
| 2007/0095652 A1 * | 5/2007 | Knowles et al. | 204/192.1 |
| 2007/0158052 A1 * | 7/2007 | Lin | 165/104.33 |
| 2007/0284089 A1 * | 12/2007 | Vadakkanmaruveedu et al. | 165/104.26 |
| 2008/0128116 A1 * | 6/2008 | Dangelo et al. | 165/104.21 |
| 2008/0283222 A1 * | 11/2008 | Chang et al. | 165/104.26 |

FOREIGN PATENT DOCUMENTS

CN  1681381 A  10/2005

* cited by examiner

*Primary Examiner*—Gregory D Thompson
(74) *Attorney, Agent, or Firm*—Frank R. Niranjan

(57) ABSTRACT

A heat spreader includes a bottom wall (12) and a cover (14) hermetically connected to the bottom wall. Cooperatively the bottom wall and the cover define a space (11) therebetween for receiving a working fluid therein. A wick structure (15) is received in the space and thermally interconnects the bottom wall and the cover. The wick structure includes at least a carbon nanotube array, which can conduct heat from the bottom wall to the cover and draw condensed liquid of the working fluid from the cover toward the bottom wall.

15 Claims, 5 Drawing Sheets

HEAT SPREADER WITH VAPOR CHAMBER DEFINED THEREIN

BACKGROUND OF THE INVENTION

1. Field of the Invention

The present invention relates to an apparatus for transfer or dissipation of heat from heat-generating components, and more particularly to a heat spreader having a vapor chamber defined therein.

2. Description of Related Art

As electronic industry continues to advance, electronic components such as central processing units (CPUs), are made to provide faster operational speeds and greater functional capabilities. When a CPU operates at a high speed, its temperature frequently increases greatly. It is desirable to dissipate the heat generated by the CPU quickly.

To solve this problem of heat generated by the CPU, a heat sink is often used to be mounted on the top of the CPU to dissipate heat generated thereby. For enhancing the heat dissipation capability of the heat sink, a heat spreader is arranged between the heat sink and the CPU, which is made of a material having a heat conductivity higher than that of the heat sink, for enhancing the speed of heat transfer from the CPU to the heat sink. However, as the CPU operates faster and faster, and, therefore generates larger and larger amount of heat, the conventional heat spreader, which transfers heat via heat conduction means, cannot meet the increased heat dissipating requirement of the CPU.

For the foregoing reasons, therefore, there is a need in the art for a cooling device which overcomes the above-mentioned problems.

SUMMARY OF THE INVENTION

The present invention relates to a heat spreader including a bottom wall and a cover hermetically connected to the bottom wall. Cooperatively the bottom wall and the cover define a space therebetween for receiving a working fluid therein. A wick structure is received in the space and thermally interconnects the bottom wall and the cover. The wick structure includes at least a carbon nanotube array (CNT array).

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present heat spreader can be better understood with reference to the following drawings. The components in the drawings are not necessarily drawn to scale, the emphasis instead being placed upon clearly illustrating the principles of the present heat spreader. Moreover, in the drawings, like reference numerals designate corresponding parts throughout the several views.

DETAILED DESCRIPTION OF THE INVENTION

Figure 1:
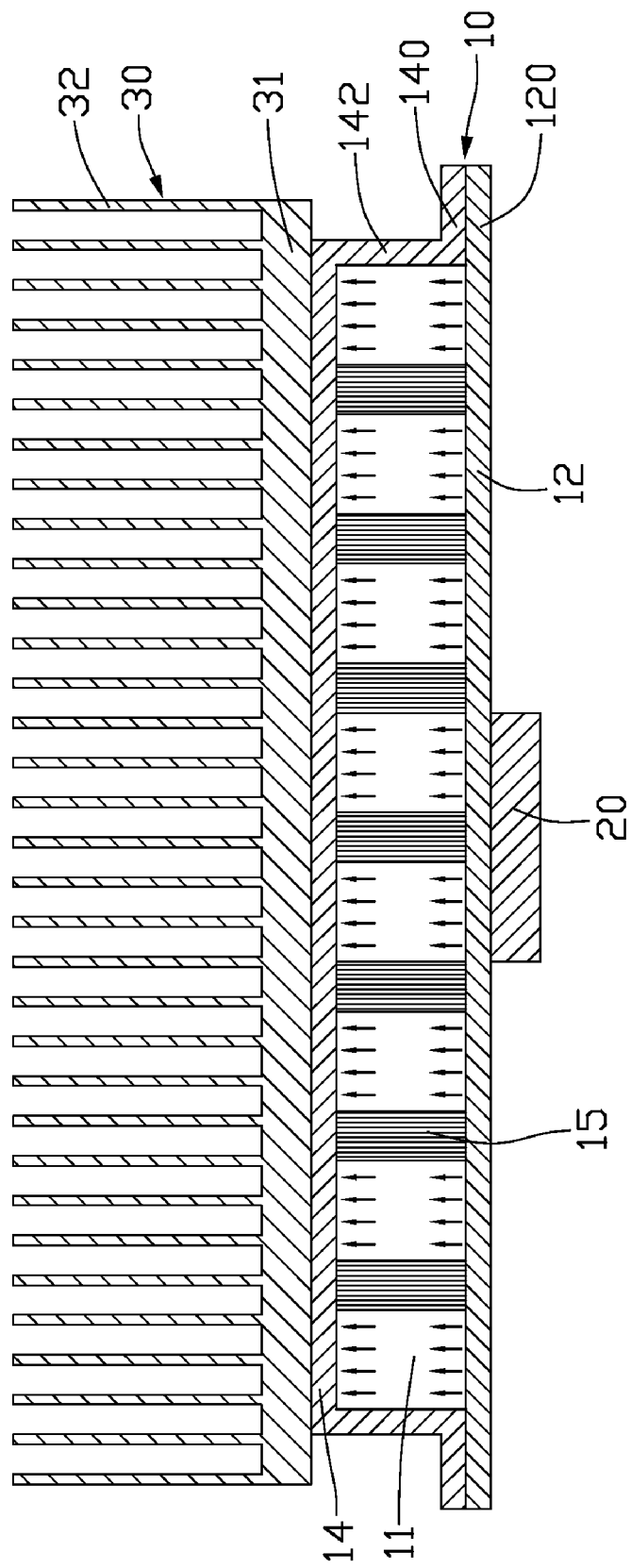
FIG. 1 is a cross-sectional view of a cooling device incorporating a heat spreader in accordance with a first embodiment of the present invention.

FIG. 1 is a cross-sectional view of a cooling device incorporating a heat spreader 10 in accordance with a first embodiment of the present invention. The cooling device is arranged on a heat-generating component 20, such as CPU (central process unit), VGA (Video Graphics Array), LED (light-emitting diode), NB (north bridge), and so on.

In this embodiment, the cooling device includes a heat spreader 10 and a fin-type heat sink 30 arranged on the heat spreader 10. The heat sink 30 is made of material with highly thermal conductivity, such as copper, aluminum, or their alloys. The heat sink 30 as shown in this embodiment is an extruded aluminum heat sink, including a chassis 31 and a plurality of pin fins 32 extending upwardly from the chassis 31. Apparently, the fins 32 are used for increasing the heat dissipation area of the heat sink 30. Alternatively, the fins 32 can be plate-like shaped. The fins 32 and the chassis 31 can be formed separately, and then connected together by soldering.

Figure 2:
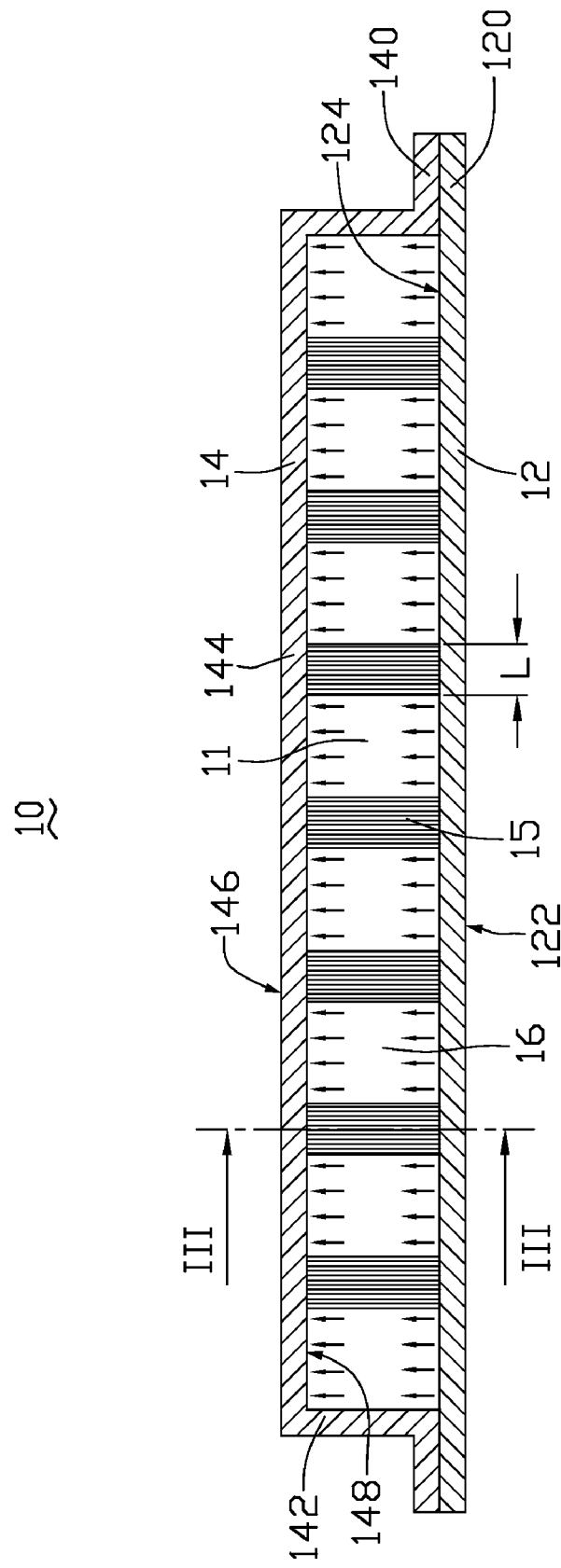
FIG. 2 shows a cross-sectional view of the heat spreader of FIG. 1.
Figure 3:
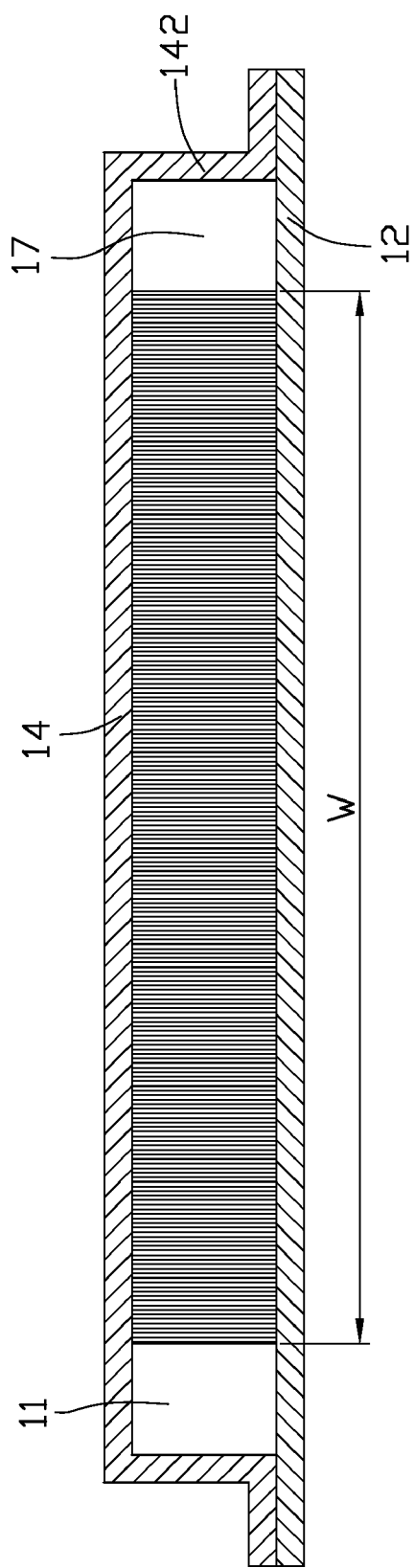
FIG. 3 is a cross-sectional view of the heat spreader of FIG. 2 taken along line III-III thereof.

Also referring to FIGS. 2-3, the heat spreader 10 includes a bottom wall 12 and a cover 14 hermetically connected to the bottom wall 12 to thereby form a sealed space 11 for containing working liquid therein. The cover 14 and the bottom wall 12 are made of copper. Alternatively, the cover 14 and the bottom wall 12 can be made of other materials with highly thermal conductivity, such as aluminum, or its alloys. The bottom wall 12 is a square-shaped plate. The bottom wall 12 includes a bottom surface 122 for contacting with and absorbing heat from the heat-generating component 20, and a top surface 124 opposing the bottom surface 122. The cover 14 includes a top wall 144 parallel to the bottom wall 12 and a side wall 142. The top wall 144 is square-shaped with a size smaller than that of the bottom wall 12. The side wall 142 extends perpendicularly and downwardly from four sides of the top wall 144. A flange 140 extends transversely and outwardly from a free end of the side wall 142. An outer periphery of the flange 140 has a size substantially the same as that of the bottom wall 12. The flange 140 of the cover 14 and an outer periphery 120 of the top surface 124 of the bottom wall 12 connect together by a soldering process which is a method widely used to connect two discrete metallic components together. Thus, the discrete cover 14 and bottom wall 12 are soldered together to form the sealed space 11 therebetween. The space 11 is in a vacuumed condition. The working liquid, such as water or alcohol, which has a lower boiling point, is received in the space 11.

A plurality of carbon nanotube arrays (CNT arrays) 15 which function as heat transfer enhancing structures and wick structures are arranged between and thermally interconnect the bottom wall 12 and the top wall 144 of the cover 14. The carbon nanotube arrays (CNT arrays) 15 are fixed in the heat spreader 10 by interference fit: bottom and top ends of each carbon nanotube array 15 are interferentially pressed by the top surface 124 of the bottom wall 12 and a bottom surface 148 of the top wall 144 of the cover 14. Alternatively, grooves can be defined in the top and bottom walls 144, 12 to receive the top and bottom ends of the carbon nanotube arrays (CNT arrays) 15 therein. Thus, the carbon nanotube arrays (CNT arrays) can be firmly assembled in the space 11. In this embodiment, the carbon nanotube arrays (CNT arrays) 15 include seven carbon nanotube arrays (CNT arrays) evenly spaced from each other along a horizontal direction, and thus eight longitudinal channels 16 are defined therebetween. Each carbon nanotube array 15 has a shape of elongated cube, in which a width W (as shown in FIG. 3) thereof is larger than a length L (as shown in FIG. 2) thereof. The width W of each carbon nanotube array 15 is a little smaller than that of the space 11, and thus two traverse channels 17 are defined by opposite sides (i.e., front and back sides) of the space 11. The traverse channels 17 communicate with the longitudinal channels 16.

One kind of such a carbon nanotube array 15 can be obtained by a method of chemical vapor deposition (CVD). Firstly aligned carbon nanotube arrays are synthesized in a hot filament plasma enhanced chemical vapor deposition (HF-PECVD) system. A substrate (metal, glass, silicon, etc.) is coated with nickel nano-particles and then introduced to the CVD chamber. Then the aligned carbon nanotube arrays are mixed with distilled water by firstly vacuuming the aligned carbon nanotube arrays to remove air therein, and then filling the distilled water in the aligned carbon nanotube arrays. The aligned carbon nanotube arrays filled with distilled water are then cooled to form a composite material of carbon nanotube arrays combined with water. Finally incises the carbon nanotube arrays from the substrate in a manner that the carbon nanotube arrays have a predetermined length; thus the carbon nanotube arrays 15 are obtained.

When assembled, the bottom surface 122 of the bottom wall 12 is thermally attached to the heat-generating component 20, and a top surface 146 of the top wall 144 is thermally attached to the chassis 31 of the heat sink 30. As the heat generated by the heat-generating component 20, which is attached to the bottom surface 122 of the bottom wall 12, is transferred to the heat spreader 10, the working fluid contained therein absorbs the heat and evaporates into vapor. Since the vapor spreads quickly, it quickly fills an interior of the heat spreader 10, and whenever the vapor comes into contact with cooler wall of the heat spreader 10 (i.e., the top wall 144 of the heat spreader 10) which thermally contact with the heat sink 30, it releases the heat to the heat sink 30. After the heat is released, the vapor condenses into liquid, which is then brought back by the carbon nanotube arrays (CNT arrays) 15 to the bottom wall 12 of the heat spreader 10. Since the heat spreader 10 transfers the heat by using phase change mechanism involving the working fluid, the heat transferred to the heat spreader 10 from the heat-generating device is thus rapidly and evenly distributed over the entire heat spreader 10 and is then conveyed to the heat sink 30 through which the heat is dissipated into ambient air.

Furthermore, the carbon nanotube arrays (CNT arrays) 15 are capable of transferring heat from the bottom wall 12 to the top wall 144 directly. Due to the carbon nanotube arrays 15 in the heat spreader 10, a heat transfer efficiency of the heat spreader 10 is highly enhanced. As nano-material have a very small size with a diameter ranging from 1~100 nm, a surface area of the nano-material is much larger than that of the same material which has the same volume. Thus a heat transfer area of the heat spreader 10 is much enlarged by having the carbon nanotube arrays (CNT arrays) 15, which, in result, improves heat transfer efficiency of the heat spreader 10. For example, the carbon nanotubes has a heat transfer coefficient about 3000-6600 W/(m·k), which is ten times more than that of copper which has a heat transfer coefficient of 375 W/(m·K). The heat spreader 10 which adopts the carbon nanotube arrays (CNT arrays) 15 thus can have a much larger heat transfer efficiency. Thus, the heat of the heat-generating component 20 can be rapidly and efficiently transferred from the bottom wall 12 to the top wall 144 of the heat spreader 10 through the carbon nanotube arrays (CNT arrays) 15, thereby can enhance heat transfer efficiency of the heat spreader 10 from the bottom wall 12 to the top wall 144. Thus, during operation, the heat generated by the heat-generating component 20 can be transferred to the heat sink 30 by the heat spreader 10 through either phase change mechanism or heat conduction which adopts nano-material with high heat transfer efficiency. In addition, heat transfer threshold by the liquid if the liquid is not able to timely contact with the top surface 148 of the top wall 144 during the initial phase of heat transfer from the bottom wall 12 to the top wall 144 can be overcome by the carbon nanotube arrays (CNT arrays) which thermally connects the bottom wall 12 and the top wall 144. Accordingly, the heat spreader 10 is still workable to transfer the heat from the heat-generating component 20 to the heat sink 30 even when the heat spreader 10 is put in an inclined position.

Figure 4:
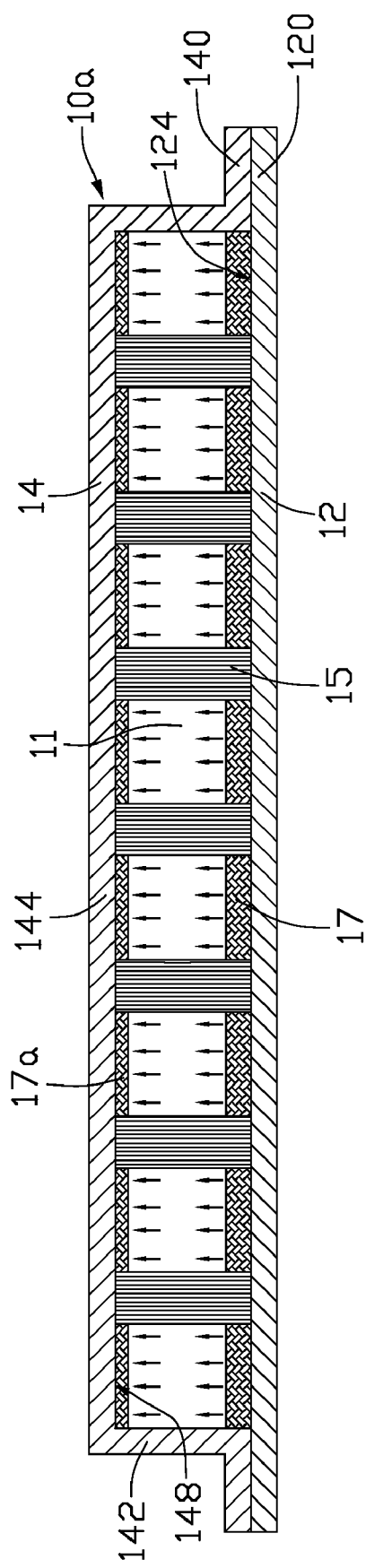
FIG. 4 is similar to FIG. 2, but shows the heat spreader in accordance with a second embodiment of the present invention.

FIG. 4 shows a second embodiment of the heat spreader 10*a*. Also the heat spreader 10*a* has a bottom wall 12 and a cover 14 hermetically connected to the bottom wall 12 to thereby form the sealed space 11. The carbon nanotube arrays 15 are arranged in the space 11 and thermally interconnect the bottom wall 12 and the top wall 144 of the cover 14. The difference between the second embodiment and the first embodiment is that the heat spreader 10*a* further has a second wick structure 17*a* arranged on the top surface 124 of the bottom wall 12 and the bottom surface 148 of the top wall 144. The second wick structure 17*a* has one of the following four configurations: sintered powder, grooves, fibers and screen meshes. In this embodiment, the second wick structure 17*a* is configured of screen mesh. The condensed vapor thus can be brought back by the carbon nanotube arrays 15 and the second wick structure 17*a* together.

Figure 5:
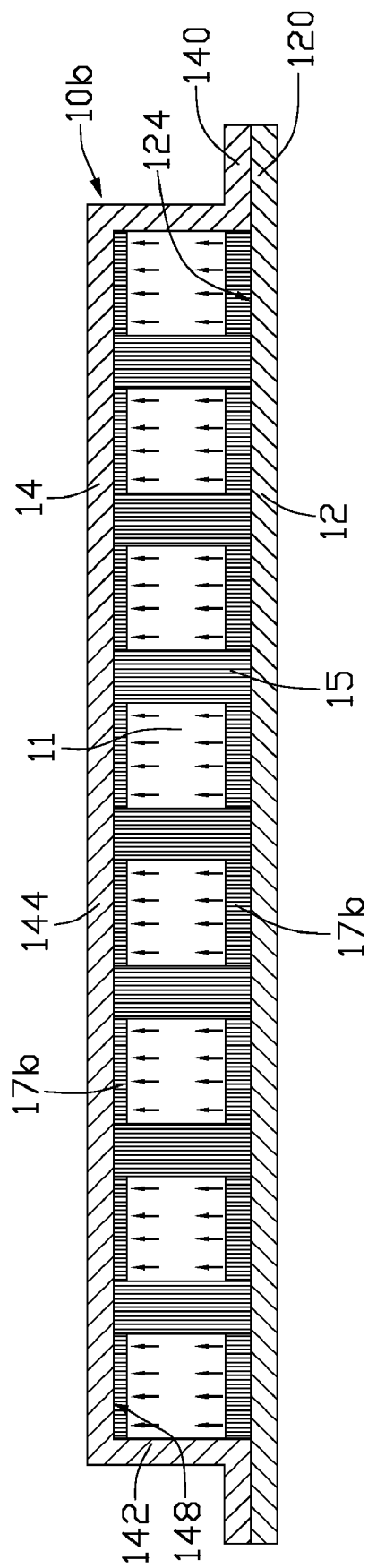
FIG. 5 is similar to FIG. 2, but shows the heat spreader in accordance with a third embodiment of the present invention.

FIG. 5 shows a third embodiment of the heat spreader 10*b*. Similar to the second embodiment, the heat spreader 10*b* has a cover 14, a bottom wall 12, the carbon nanotube arrays 15 arranged between the bottom wall 12 and the cover 14, and a second wick structure 17*b* arranged on the top surface 124 of the bottom wall 12 and the bottom surface 148 of the top wall 144 of the cover 14. In this embodiment, the second wick structure 17*b* is made of a material like that forming the carbon nanotube arrays 15, i.e., carbon nanotubes (CNTs). The second wick structure 17*b* can also be formed as the carbon nanotube arrays 15, i.e., by firstly forming the carbon nanotubes on a silicon substrate and then fixing the carbon nanotubes to the top and bottom walls 144, 12 of the heat spreader 10 by for example gluing. Alternatively, the second wick structure 17*b* can be formed on the top and bottom walls 144, 12 of the heat spreader 10 directly. In this case, the top and bottom walls 144, 12 are adopted as the substrate to form the carbon nanotubes (CNTs) of the wick structure 17*b* thereon. Thus the heat spreader 10 and the second wick structure 17*b* are integral, and assembly of the second wick structure 17*b* to the heat spreader 10 by gluing can be avoided.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat spreader, comprising:
   a bottom wall;
   a cover hermetically connected to the bottom wall to thereby form a sealed space which contains working liquid therein; and
   a wick structure received in the space and thermally interconnecting the bottom wall and the cover;

wherein the wick structure comprises a plurality of carbon nanotube arrays being evenly spaced from each other; and wherein a first channel is defined between each two neighboring carbon nanotube arrays, and a second channel is defined at each of two opposite sides of the carbon nanotube arrays, the second channel being perpendicular to and communicating with the first channel.

2. The heat spreader of claim 1, further comprising another wick structure formed on inner surfaces of the bottom wall and the cover.

3. The heat spreader of claim 2, wherein the cover and bottom wall are made of copper, and the another wick structure comprises at least a carbon nanotube array formed on the cover and the bottom wall of the heat spreader directly.

4. The heat spreader of claim 2, wherein the another wick structure has one of the following four configurations: sintered powder, grooves, fibers and screen meshes.

5. The heat spreader of claim 1, wherein the cover includes a top wall, a side wall extending substantially perpendicularly from the top wall, and a flange extending transversely and outwardly from a free end of the side wall, the flange of the cover and an outer periphery of the bottom wall being connected together by a soldering process to hermetically connect the cover to the bottom wall.

6. A cooling device, comprising:
a heat spreader for thermally attaching to a heat-generating device, comprising:
a bottom wall;
a cover hermetically connected to the bottom wall to thereby form a sealed space for containing working liquid therein; and
a wick structure received in the space and thermally interconnecting the bottom wall and the cover; and
a heat sink being thermally mounted on the heat spreader;
wherein the wick structure comprises a plurality of carbon nanotube arrays being evenly spaced from each other; and
wherein a first channel is defined between each two neighboring carbon nanotube arrays, and a second channel is defined at each of two opposite sides of the carbon nanotube arrays, the second channel being perpendicular to and communicating with the first channel.

7. The cooling device of claim 6, further comprising another wick structure formed on inner surfaces of the bottom wall and the cover.

8. The cooling device of claim 7, wherein the cover and the bottom wall are made of copper, and the another wick structure comprises at least a carbon nanotube array formed on the cover and the bottom wall of the heat spreader directly.

9. The cooling device of claim 7, wherein the another wick structure has one of the following four configurations: sintered powder, grooves, fibers and screen meshes.

10. The cooling device of claim 6, wherein the cover includes a top wall, a side wall extending substantially perpendicularly from the top wall, and a flange extending transversely and outwardly from a free end of the side wall, the flange of the cover and an outer periphery of the bottom wall being connected together by a soldering process to hermetically connect the cover to the bottom wall.

11. A cooling device comprising:
a bottom wall having a bottom surface thermally connecting with a heat-generating electronic component;
a cover hermetically connected to the bottom wall and defining an inner space with the bottom wall;
liquid received in the inner space, wherein the liquid evaporates into vapor when the bottom wall receives heat from the heat-generating electronic component; and
carbon nanotubes received in the inner space, thermally interconnecting the bottom wall and the cover and functioning as first wick structure drawing condensed liquid formed by the vapor from the cover toward the bottom wall;
wherein the carbon nanotubes are divided into a plurality of arrays with a first channel defined between each two neighboring arrays and a second channel at each of opposite sides of the arrays, the first channel communicating with the second channel.

12. The cooling device of claim 11, wherein the carbon nanotubes are divided into a plurality of arrays, and at least one of the cover and the bottom wall is attached with a second wick structure in the inner space.

13. The cooling device of claim 12, wherein the second wick structure is made of one of the following structures: sintered powder, grooves, fibers and screen meshes.

14. The cooling device of claim 12, wherein the second wick structure is made of carbon nanotubes.

15. The cooling device of claim 11, wherein the second channels is perpendicular to the first channel.

* * * * *